(12) United States Patent
Huang et al.

(10) Patent No.: US 12,339,421 B2
(45) Date of Patent: Jun. 24, 2025

(54) ANTI-REFLECTIVE OPTICAL COATINGS AND METHODS OF FORMING THE SAME

(71) Applicant: CORNING INCORPORATED, Corning, NY (US)

(72) Inventors: Ming-Huang Huang, Ithaca, NY (US); Hoon Kim, Horseheads, NY (US); Jue Wang, Pittsford, NY (US)

(73) Assignee: CORNING INCORPORATED, Corning, NY (US)

( * ) Notice: Subject to any disclaimer, the term of this patent is extended or adjusted under 35 U.S.C. 154(b) by 231 days.

(21) Appl. No.: 17/980,139

(22) Filed: Nov. 3, 2022

(65) Prior Publication Data

US 2023/0161077 A1 May 25, 2023

Related U.S. Application Data

(60) Provisional application No. 63/282,467, filed on Nov. 23, 2021.

(51) Int. Cl.
| | | |
|---|---|---|
| *G02B 1/115* | (2015.01) | |
| *C23C 16/40* | (2006.01) | |
| *C23C 16/455* | (2006.01) | |

(52) U.S. Cl.
CPC ............ *G02B 1/115* (2013.01); *C23C 16/402* (2013.01); *C23C 16/403* (2013.01);
(Continued)

(58) Field of Classification Search
CPC ... C23C 16/402; C23C 16/403; C23C 16/405; C23C 16/45527; C23C 16/45553; G02B 1/115; G02B 13/143
See application file for complete search history.

(56) References Cited

U.S. PATENT DOCUMENTS

| | | |
|---|---|---|
| 5,250,740 A | 10/1993 | Mackey et al. |
| 11,320,568 B2 | 5/2022 | Huang et al. |

(Continued)

FOREIGN PATENT DOCUMENTS

| | | |
|---|---|---|
| EP | 2215502 B1 | 10/2017 |
| JP | 2000-121801 A | 4/2000 |

(Continued)

OTHER PUBLICATIONS

Terayama CN 101271166 A (Year: 2008).*
(Continued)

*Primary Examiner* — Lawrence D Ferguson (57) ABSTRACT

According to at least one feature of the present disclosure, a method of forming a film of an optical element, includes: positioning a substantially transparent lens in a reactor chamber, wherein the lens defines a curved surface; exposing the lens to a first precursor comprising one of lanthanum or gadolinium such that the first precursor is deposited on the curved surface of the lens; exposing the first precursor on the curved surface to a first oxidizer such that the first precursor present on the curved surface of the lens reacts with the first oxidizer to form a high refractive index layer of the film; exposing the high refractive index layer to a second precursor such that the second precursor is deposited on the high refractive index layer; and exposing the second precursor on the high refractive index layer to a second oxidizer such that the second precursor present on the high refractive index layer reacts with the second oxidizer to form a low refractive index layer of the film.

14 Claims, 4 Drawing Sheets

(52) U.S. Cl.
CPC ...... *C23C 16/405* (2013.01); *C23C 16/45527* (2013.01); *C23C 16/45553* (2013.01)

(56) References Cited

U.S. PATENT DOCUMENTS

| | | |
|---|---|---|
| 2005/0201422 A1 | 9/2005 | Ohta et al. |
| 2009/0141358 A1 | 6/2009 | Cangemi et al. |
| 2013/0321922 A1 | 12/2013 | Cangemi et al. |
| 2019/0346590 A1 | 11/2019 | Huang et al. |
| 2021/0032744 A1 | 2/2021 | Huang et al. |

FOREIGN PATENT DOCUMENTS

| | | |
|---|---|---|
| WO | 2012/074511 A2 | 6/2012 |
| WO | 2017/025957 A1 | 2/2017 |

OTHER PUBLICATIONS

Amusan et al., "Ag films grown by remote plasma enhanced atomic layer deposition on different Substrates," J. Vac. Sci. Technol. A 34(1), 01A126 (2016).

Hennessy et al., "Ultraviolet optical properties of aluminum fluoride thin films deposited by atomic layer deposition," J. Vac. Sci. Technol. A 34, 01A120 (2016).

Invitation to Pay Additional Fees and, Where Applicable, Protest Fee; PCT/US2022/049359; dated Mar. 1, 2023, 13 pages; European Patent Office.

John Hennessy et al, "Atomic layer deposition of magnesium fluoride via bis(ethylcyclopentadienyl)magnesium and anhydrous hydrogen fluoride," J. Vac. Sci. Technol. A 33(1), 01A125 (2015).

Kesselsa et al., "Plasma-Assisted Atomic Layer Deposition: Basics, Opportunities, and Challenges," J. Vac. Sci. Technol. A 29(5), 050801 (2011).

Li Xu et al., "Improvement Of The Laser-Induced Damage Threshold Of Oxide/Fluoride Double Stack High Reflective Coatings At 355nm By Introducing Interlayers", Applied Surface Science, vol. 280, Sep. 1, 2013, pp. 772-775.

Sang-Won Kang et al., "Study on the characteristics of aluminum thin films prepared by atomic layer deposition," J. Vac. Sci. Technol. A 20(6), 1986 (2002).

Szeghalmi et al., "Atomic layer deposition for antireflection coatings using SiO2 as low-refractive index material," SPIE_96270Q (2015).

Vermeer et a;., "Spatial atomic layer deposition: A route towards further industrialization of atomic layer deposition," J. Vac. Sci. Technol. A 30(1), 010802-1 (2012).

Wu et al; "Optical coatings with ultralow refractive index SiO2 films," SPIE 7504, 75040F (2009).

* cited by examiner

ANTI-REFLECTIVE OPTICAL COATINGS AND METHODS OF FORMING THE SAME

BACKGROUND

This Application claims the benefit of priority to U.S. Provisional Patent Application Ser. No. 63/282,467 filed on Nov. 23, 2021, the content of which is relied upon and incorporated herein by reference in its entirety.

FIELD OF THE DISCLOSURE

The present disclosure generally relates to optical elements, and more specifically, to anti-reflective optical coating.

High numerical aperture (NA) lenses for optical systems in the deep ultra-violet (DUV) or broadband spectral wavelengths may require many elements, some of which can have very steep surface curvatures. Steep surfaces create challenges for high-performance coatings over a wide angle range and/or a broad spectral bandwidth as the application of the films to curved surfaces may produce non-uniform thickness films and the like. Conventional films on lenses may be produced via physical vapor deposition (PVD) which is a line-of-sight deposition process. As coating material from the PVD process arrives at very large angles relative to the lens surface, the coating may exhibit thickness and mechanical properties which may be substantially different towards the edge compared to the center of the lens surface. The low coating uniformity leads to high spectral reflectance and polarization split at the edge of the lens. Several technical approaches have been explored to address the issue, such as tilting and masking. Both tilting and masking approaches can improve some coating uniformity on steep surfaces, but reduces coating packing density towards the center, leading to an increase scatter loss at the center. Accordingly, new optical films and methods of making them may be advantageous.

SUMMARY OF THE DISCLOSURE

According to at least one feature of the present disclosure, an optical element includes an optically transparent lens defining a curved surface; and a film positioned on the curved surface, the film comprising: a first layer of hafnium oxide ($HfO_2$) positioned on the curved surface, a second layer of aluminum fluoride ($AlF_3$) positioned on the first layer, and a third layer of silicon dioxide ($SiO_2$) positioned on the second layer.

According to at least one feature of the present disclosure, an optical element includes an optically transparent lens defining a curved surface; and a film positioned on the curved surface, the film comprising: a first layer of aluminum oxide ($Al_2O_3$) positioned on the curved surface, a second layer of aluminum fluoride ($AlF_3$) positioned on the first layer, and a third layer of silicon dioxide ($SiO_2$) positioned on the second layer.

According to at least one feature of the present disclosure, an optical element includes an optically transparent lens defining a curved surface; and a film positioned on the curved surface, the film comprising: a first layer of lanthanum fluoride ($LaF_3$) positioned on the curved surface, a second layer of aluminum fluoride ($AlF_3$) positioned on the first layer, and a third layer of silicon dioxide ($SiO_2$) positioned on the second layer.

According to at least one feature of the present disclosure, an optical element includes an optically transparent lens defining a curved surface; and a film positioned on the curved surface, the film comprising: a first layer of aluminum fluoride ($AlF_3$) positioned on the curved surface, a second layer of lanthanum fluoride ($LaF_3$) positioned on the first layer, a third layer of aluminum fluoride ($AlF_3$) positioned on the second layer, and a fourth layer of silicon dioxide ($SiO_2$) positioned on the third layer.

According to at least one feature of the present disclosure, an optical element includes an optically transparent lens defining a curved surface; and a film positioned on the curved surface, the film comprising: a first layer of aluminum fluoride ($AlF_3$) positioned on the curved surface, a second layer of lanthanum fluoride ($LaF_3$) positioned on the first layer, a third layer of aluminum fluoride ($AlF_3$) positioned on the second layer, a fourth layer of lanthanum fluoride ($LaF_3$) positioned on the third layer, a fifth layer of aluminum fluoride ($AlF_3$) positioned on the fourth layer, and a sixth layer of silicon dioxide ($SiO_2$) positioned on the fifth layer.

According to at least one feature of the present disclosure, a method of forming a film of an optical element, comprising the step of: positioning a substantially transparent lens in a reactor chamber, wherein the lens defines a curved surface; exposing the lens to a first precursor comprising one of lanthanum or gadolinium such that the first precursor is deposited on the curved surface of the lens; exposing the first precursor on the curved surface to a first oxidizer such that the first precursor present on the curved surface of the lens reacts with the first oxidizer to form a high refractive index layer of the film; exposing the high refractive index layer to a second precursor such that the second precursor is deposited on the high refractive index layer; and exposing the second precursor on the high refractive index layer to a second oxidizer such that the second precursor present on the high refractive index layer reacts with the second oxidizer to form a low refractive index layer of the film.

These and other features, advantages, and objects of the present disclosure will be further understood and appreciated by those skilled in the art by reference to the following specification, claims, and appended drawings.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

In the drawings.

DETAILED DESCRIPTION

Additional features and advantages of the invention will be set forth in the detailed description which follows and will be apparent to those skilled in the art from the description, or recognized by practicing the invention as described in the following description, together with the claims and appended drawings.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions.

It will be understood by one having ordinary skill in the art that construction of the described disclosure, and other components, is not limited to any specific material. Other exemplary embodiments of the disclosure disclosed herein may be formed from a wide variety of materials, unless described otherwise herein.

For purposes of this disclosure, the term "coupled" (in all of its forms: couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature, or may be removable or releasable in nature, unless otherwise stated.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures, and/or members, or connectors, or other elements of the system, may be varied, and the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

Figure 1A:
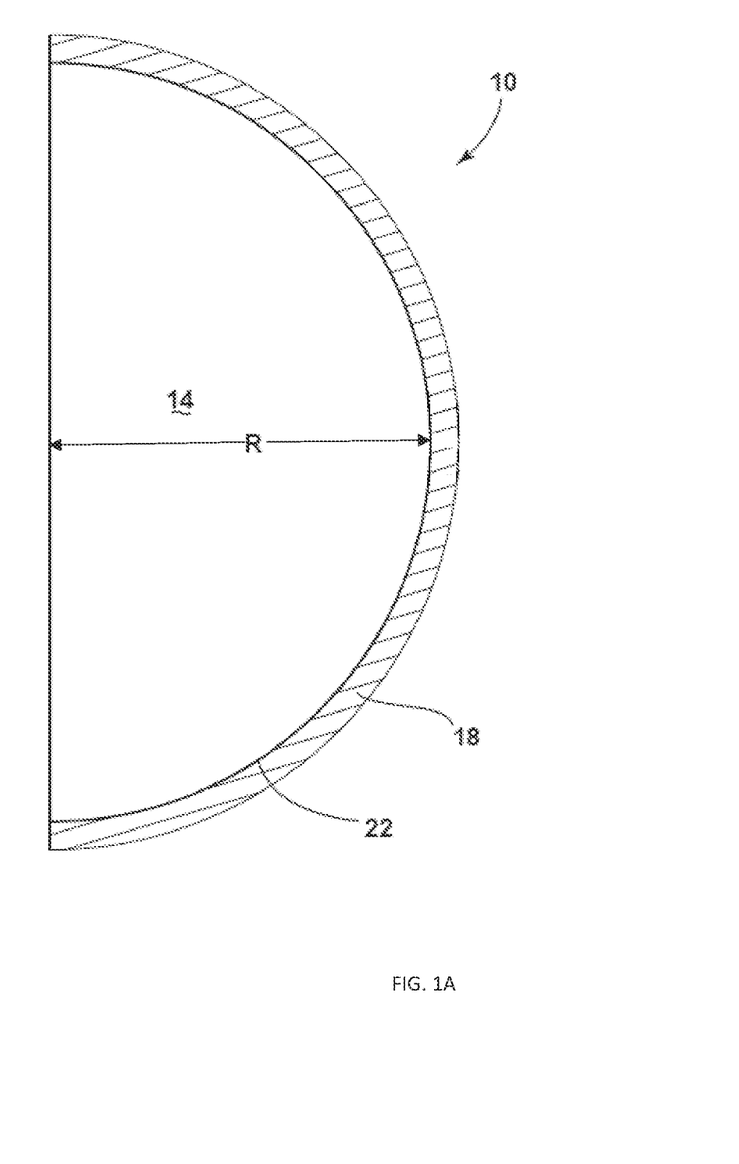
FIG. 1A-1B is a schematic view of an optical element, according to at least one example.
Figure 1B:
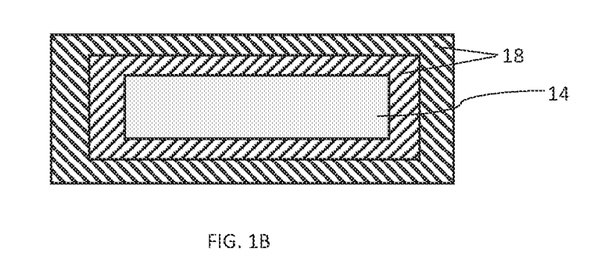

Referring now to FIG. 1A-1B, an optical element 10 includes a lens 14 and a film 18. As will be explained in detail below, the film 18 may be a multilayered structure which may provide one or more properties to the lens 14 such as mechanical properties (e.g., scratch resistance) and/or optical properties (e.g., anti-reflection and color neutrality).

The lens 14 may include a glass, a glass-ceramic, a ceramic material and/or combinations thereof. Exemplary glass-based examples of the lens 14 may include soda lime glass, alkali aluminosilicate glass, alkali containing borosilicate glass and/or alkali aluminoborosilicate glass. For purposes of this disclosure, the term "glass-based" may mean a glass, a glass-ceramic and/or a ceramic material. According to various examples, the lens 14 may be a glass-based substrate. In glass-based examples of the lens 14, the lens 14 may be strengthened (e.g., alkali exchanged) or strong (e.g., polished to remove defects). The lens 14 may be substantially clear, transparent and/or free from light scattering. For example, the lens 14 may have a transmittance of from about 50% to about 100% at one or more wavelengths or wavelength bands over a wavelength range of from about 180 nm to about 700 nm. In glass-based examples of the lens 14, the lens 14 may have a refractive index in the range from about 1.45 to about 1.55 at a wavelength of about 266 nm. Further, the lens 14 of the optical element 10 may include sapphire and/or polymeric materials. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

The lens 14 may define one or more curved surfaces 22. The curved surfaces 22 aid in defining the lens 14 to have a generally curved shape. The curved surfaces 22 may form the lens 14 to have a generally concave, convex, biconvex, plano-convex, positive meniscus, negative meniscus, planoconcave, biconcave and/or combinations thereof. The curved surface 22 may have a steepness, or "speed," which is expressed as an R/# value. The R/# value may be calculated as a radius of curvature (R) divided by the clear aperture of the lens 14. For purposes of this disclosure, the radius of curvature may be defined as the distance between a vertex of the lens 14 and the center of curvature. For purposes of this disclosure, the clear aperture is defined as the diameter or size of the lens 14 through which light may pass. Clear aperture may be expressed herein as a fraction or decimal which indicates the distance from the center (e.g., 0.0 ca) of the clear aperture to the edge (1.0 ca) of the clear aperture. For example, halfway between the center of the clear aperture and the edge of the clear aperture is 0.5 ca.

The R/# of the curved surface 22 may be from about 0.5 to about 1.0, or from about 0.6 to about 1.0, or from about 0.7 to about 1.0, or from about 0.8 to about 1.0, or from about 0.9 to about 1.0. For example, the R/# value may be about 0.5, about 0.55, about 0.6, about 0.65, about 0.7, about 0.75, about 0.8, about 0.85, about 0.9, about 0.95, about 0.99, or any and all values and ranges therebetween. According to various examples, the curved surface 22 may have an R/# value of about 0.5 or greater. It will be understood that it is contemplated that one or more of the curved surfaces 22 of the lens 14 may have an R/# value of greater than 1 (e.g., 2 or greater, 5 or greater, 10 or greater, or 100 or greater) without departing from the teachings provided herein.

Still referring to FIG. 1A-1B, the film 18 is depicted as positioned directly on the curved surface 22 of the lens 14, but it will be understood that one or more layers, coatings and/or films may be positioned between the film 18 and the lens 14. For example, a crack mitigation layer, an adhesion layer, an electrically conductive layer, an electrically insulating layer, an optical layer, an anti-reflection layer, a protective layer, a scratch-resistant layer, a high hardness layer, other types of layers and/or combinations thereof may be positioned between the film 18 and the lens 14. Further, the film 18 may be positioned on more than one surface of the lens 14. For example, the film 18 may be positioned across multiple curved surfaces 22 and/or extend onto flat surfaces of the lens 14 without departing from the teachings provided herein.

The term "film," as applied to the film 18 and/or other films incorporated into the optical element 10, includes one or more layers that are formed by any known method in the art, including discrete deposition or continuous deposition processes. Such layers may be in direct contact with one another. The layers may be formed from the same material or more than one different material. In one or more alternative examples, such layers may have intervening layers of different materials disposed therebetween. In one or more examples, the film 18 may include one or more contiguous and uninterrupted layers and/or one or more discontinuous and interrupted layers (i.e., layers having different materials formed adjacent to one another).

The film 18 may be formed using various deposition methods such as vacuum deposition techniques, for example, chemical vapor deposition (e.g., plasma-enhanced chemical vapor deposition, low-pressure chemical vapor deposition, atmospheric pressure chemical vapor deposition, and plasma-enhanced atmospheric pressure chemical vapor deposition), physical vapor deposition (e.g., reactive or nonreactive sputtering or laser ablation), thermal or e-beam evaporation and/or atomic layer deposition. One or more layers of the optical film 18 may include nano-pores or mixed-materials to provide specific refractive index ranges or values.

The thickness of the film 18 may be in the range from about 60 nm to about 70 nm, or from about 62 nm to about 70 nm. According to other examples, the film 18 may have a thickness in the range from about 65 nm to about 70 nm. It will be understood that any and all values and ranges between above-noted values are contemplated.

According to various examples, the thickness of the film 18, or any layers thereof as described in greater detail below, may have a high uniformity. For example, the thickness of the film 18 and/or any layers thereof may have a variance in thickness of from about ±0 nm to about ±100 nm as measured between any two points along the film 18 and/or layer. For example, the film 18 and/or any layers thereof may have a variance in thickness of about ±100 nm or less, about ±90 nm or less, about ±80 nm or less, about ±70 nm or less, about ±60 nm or less, about ±50 nm or less, about ±40 nm or less, about ±30 nm or less, about ±20 nm or less, about ±10 nm or less, about ±9 nm or less, about ±8 nm or less, about ±7 nm or less, about ±6 nm or less, about ±5 nm or less, about ±4 nm or less, about ±3 nm or less, about ±2 nm or less, about ±1 nm or less, about ±0.5 nm or less, about ±0.1 nm or less or any and all values and ranges therebetween. As will be explained in greater detail below, the high uniformity of the film 18 may be advantageous in ensuring consistent optical properties of the optical element 10 across various clear aperture locations.

Figure 2:
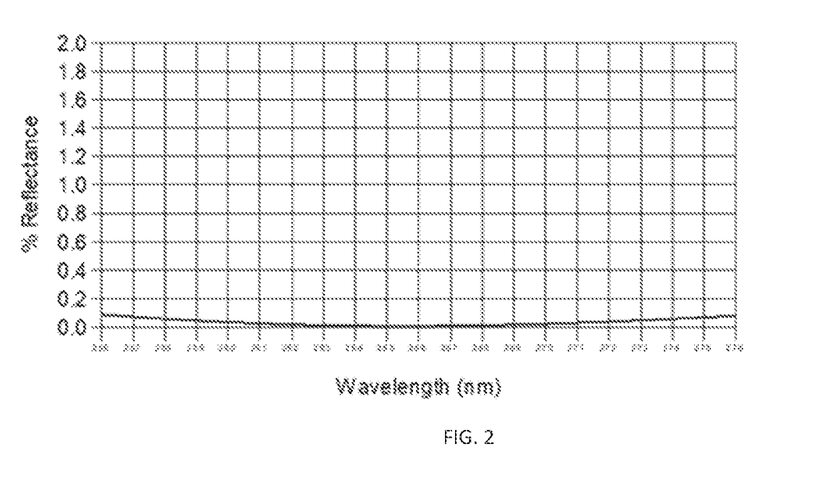
FIG. 2 is a plot that depicts reflectance (%) vs. wavelength (nm) for a film deposited on the optical element depicted in FIG. 1A-1B, according to at least one example.

A first exemplary film 18 composition includes a first layer of hafnium oxide (HfO2) positioned on the curved surface, a second layer of aluminum fluoride (AlF3) positioned on the first layer, and a third layer of silicon dioxide (SiO2) positioned on the second layer. The first layer of hafnium oxide has a thickness of about 1 nm to about 8 nm. The second layer of aluminum fluoride has a thickness of about 50 nm to about 60 nm. The third layer of silicon dioxide has a thickness of about 1 nm to about 2 nm. FIG. 2 is a plot that depicts reflectance (%) vs. wavelength (nm) for a first exemplary film deposited on the optical element depicted in FIG. 1A-1B. FIG. 2 depicts that the modelled reflectance of the first exemplary film is less than 0.2% over a normal angle of incidence (90°) at a wavelength of 256 nm to 276 nm.

Figure 3:
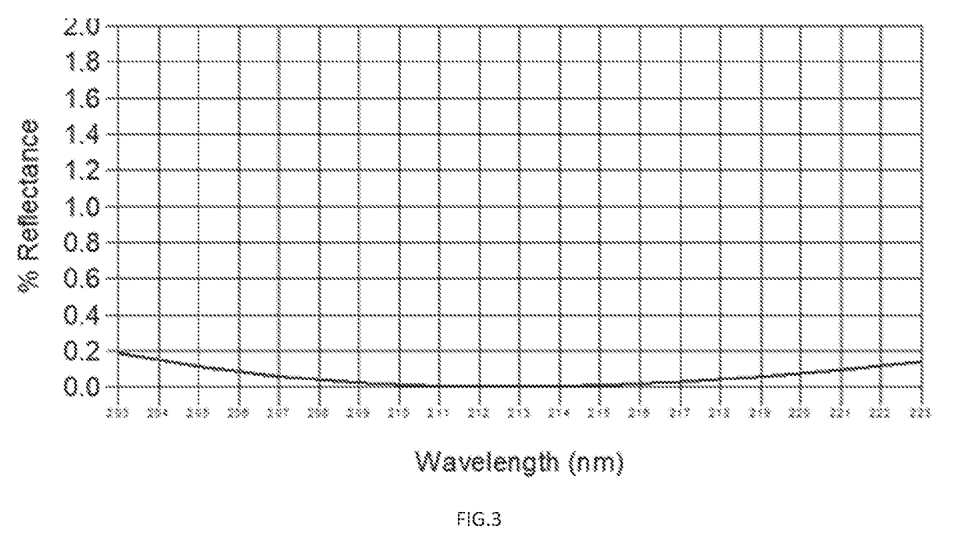
FIG. 3 is a plot that depicts reflectance (%) vs. wavelength (nm) for a film deposited on the optical element depicted in FIG. 1A-1B, according to at least one example.

A second exemplary film 18 composition includes a first layer of aluminum oxide ($Al_2O_3$) positioned on the curved surface, a second layer of aluminum fluoride ($AlF_3$) positioned on the first layer, and a third layer of silicon dioxide ($SiO_2$) positioned on the second layer. The first layer of aluminum oxide has a thickness of about 15 nm to about 20 nm. The second layer of aluminum fluoride has a thickness of about 35 nm to about 40 nm. The third layer of silicon dioxide has a thickness of about 1 nm to about 2 nm. FIG. 3 is a plot that depicts reflectance (%) vs. wavelength (nm) for a second exemplary film deposited on the optical element depicted in FIG. 1A-1B. FIG. 3 depicts that the modelled reflectance of the second exemplary film is less than 0.2% a normal angle of incidence (90°) at a wavelength of 256 nm to 276 nm.

Figure 4:
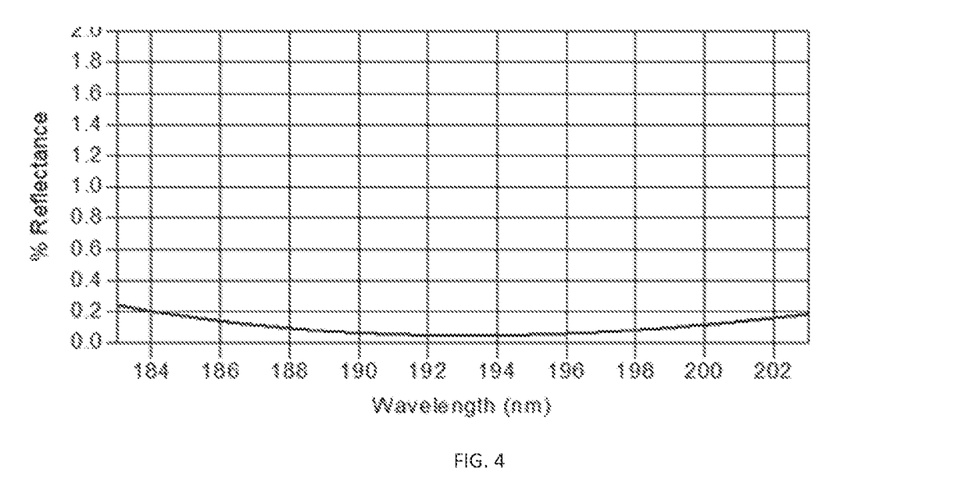
FIG. 4 is a plot that depicts reflectance (%) vs. wavelength (nm) for a film deposited on the optical element depicted in FIG. 1A-1B, according to at least one example.

A third exemplary film 18 composition includes a first layer of lanthanum fluoride ($LaF_3$) positioned on the curved surface, a second layer of aluminum fluoride ($AlF_3$) positioned on the first layer, and a third layer of silicon dioxide ($SiO_2$) positioned on the second layer. The first layer of aluminum oxide has a thickness of about 25 nm to about 28 nm. The second layer of aluminum fluoride has a thickness of about 30 nm to about 32 nm. The third layer of silicon dioxide has a thickness of about 1 nm to about 2 nm. FIG. 4 is a plot that depicts reflectance (%) vs. wavelength (nm) for a third exemplary film deposited on the optical element depicted in FIG. 1A-1B. FIG. 4 depicts that the modelled reflectance of the third exemplary film is less than 0.3% over a normal angle of incidence (90°) at a wavelength of 256 nm to 276 nm.

Figure 5:
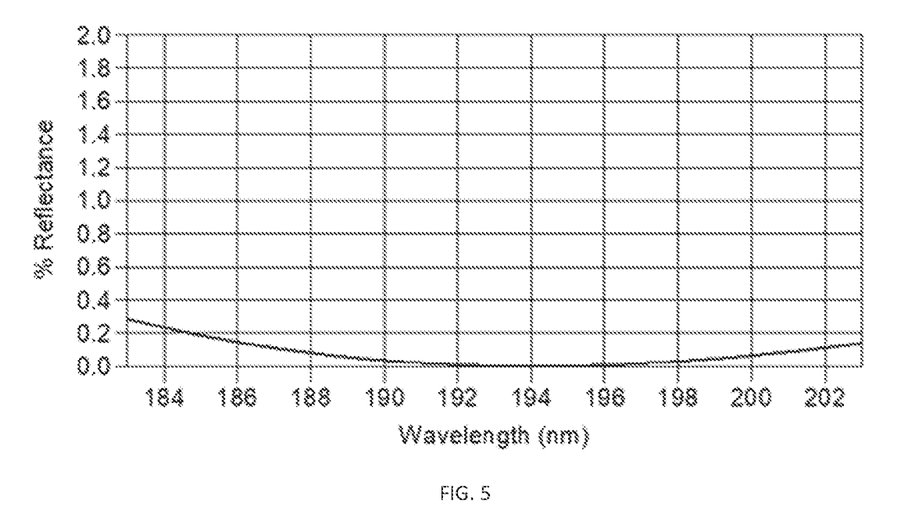
FIG. 5 is a plot that depicts reflectance (%) vs. wavelength (nm) for a film deposited on the optical element depicted in FIG. 1A-1B, according to at least one example.

A fourth exemplary film 18 composition includes a first layer of aluminum fluoride ($AlF_3$) positioned on the curved surface, a second layer of lanthanum fluoride ($LaF_3$) positioned on the first layer, a third layer of aluminum fluoride ($AlF_3$) positioned on the second layer, a fourth layer of silicon dioxide ($SiO_2$) positioned on the third layer. The first layer of aluminum fluoride has a thickness of about 1 nm to about 2 nm. The second layer of lanthanum fluoride has a thickness of about 25 nm to about 28 nm. The fourth layer of silicon dioxide has a thickness of about 1 nm to about 2 nm. FIG. 5 is a plot that depicts reflectance (%) vs. wavelength (nm) for a fourth exemplary film deposited on the optical element depicted in FIG. 1A-1B. FIG. 5 depicts that the modelled reflectance of the fourth exemplary film is less than 0.3% over a normal angle of incidence (90°) at a wavelength of 256 nm to 276 nm.

A fifth exemplary film 18 composition includes a first layer of aluminum fluoride ($AlF_3$) positioned on the curved surface, a second layer of lanthanum fluoride ($LaF_3$) positioned on the first layer, a third layer of aluminum fluoride ($AlF_3$) positioned on the second layer, a fourth layer of lanthanum fluoride ($LaF_3$) positioned on the third layer, a fifth layer of aluminum fluoride ($AlF_3$) positioned on the fourth layer, and a sixth layer of silicon dioxide ($SiO_2$) positioned on the fifth layer. The first layer of aluminum fluoride has a thickness of about 1 nm to about 2 nm. The second layer of lanthanum fluoride has a thickness of about 10 nm to about 15 nm. The third layer of aluminum fluoride has a thickness of about 30 nm to about 32 nm. The fourth layer of lanthanum fluoride has a thickness of about 1 nm to about 2 nm. The fifth layer of aluminum fluoride has a thickness of about 1 nm to about 2 nm. The sixth layer of silicon dioxide has a thickness of about 1 nm to about 2 nm.

Figure 6:
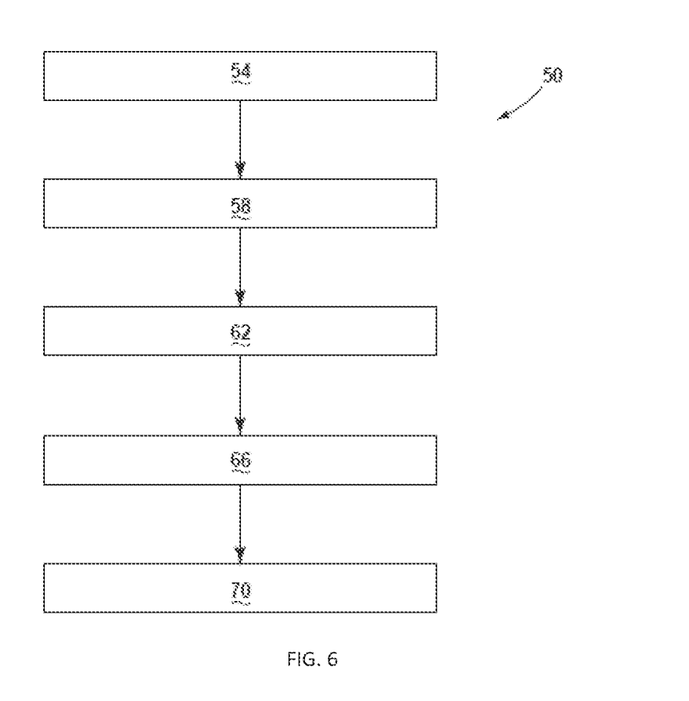
FIG. 6 is a flowchart of an exemplary method of forming the optical element, according to at least one example.

Referring now to FIG. 6, depicted is an exemplary method 50 of forming the optical element 10. The method 50 may begin with a step 54 of positioning the substantially transparent lens 14 in a reactor chamber, wherein the lens 14 defines the curved surface 22. According to various examples, the lens 14 may have a steepness given by an R/# value of from about 0.5 to about 1.0. According to various examples, the reactor may be an atomic layer deposition reactor. In such examples, the lens 14 may be positioned within the reactor such that one or more precursors and/or oxidizers which enter the reactor contact the curved surface 22. Atomic layer deposition is a thin film growth technique based on the sequential exposure of a substrate to self-limiting surface half-reactions.

Next, a step 58 of exposing the lens 14 to a first precursor such that the first precursor is deposited on the curved surface 22 of the lens 14 is performed. In embodiments, the first precursor is a lanthanum containing precursor such as tris(N,N'-diisopropylformamidinato)lanthanum La(iPr2-fmd)3 or La(iPrCp)2(iPr-amd) or a gadolinium containing precursor such as gadolinium tris(N,N'—N,N'iisopropylacetamidinate) Gd(iPr2-Me-amd)3 or Gd(iPrCp)2(iPr-amd). The first precursor may be exposed to the curved surface 22 for a time period ranging from about 0.1 s to about 0.6 s, or from about 0.1 s to about 0.5 s, or from about 0.1 s to about 0.4 s, or from about 0.1 s to about 0.3 s, or from about 0.1 s to about 0.2 s. For example, the first precursor may be exposed to the curved surface 22 of the lens 14 for about 0.1 s, about 0.2 s, about 0.3 s, about 0.4 s, about 0.5 s, about 0.6 second and any and all values and ranges therebetween.

Next, a first oxidizer may be introduced to the reactor in a step 62 of exposing the first precursor on the curved surface 22 to the first oxidizer such that the first precursor present on the curved surface 22 of the lens reacts with the first oxidizer to form a high refractive index layer of the film 18 is performed. The first oxidizer may include water vapor, ozone, other materials which may oxidize the first precursor and/or combinations thereof. The first oxidizer may be exposed to the first precursor for a time period ranging from about 0.1 s to about 0.6 s, or from about 0.1 s to about 0.5 s, or from about 0.1 s to about 0.4 s, or from about 0.1 s to about 0.3 s, or from about 0.1 s to about 0.2 s. For example, the first oxidizer may be exposed to the first precursor for about 0.1 s, about 0.2 s, about 0.3 s, about 0.4 s, about 0.5 s, about 0.6 second and any and all values and ranges therebetween. It will be understood that steps 58 and 62 may be repeated until a desired thickness (e.g., of the composite layer 34, the first layers 38 and/or second layers 42) is reached.

Next, a step 66 of exposing the high refractive index layer to a second precursor such that the second precursor is deposited on the high refractive index layer is performed. The second precursor may be exposed to the high refractive index layer for a time period ranging from about 0.1 s to about 0.6 s, or from about 0.1 s to about 0.5 s, or from about 0.1 s to about 0.4 s, or from about 0.1 s to about 0.3 s, or from about 0.1 s to about 0.1 s to about 0.2 s. For example, the second precursor may be exposed to the curved surface 22 of the lens 14 for about 0.1 s, about 0.2 s, about 0.3 s, about 0.4 s, about 0.5 s, about 0.6 second and any and all values and ranges therebetween. The second precursor may include tris(dimethylamino)silane, bis(diethylamino)silane, N-(diethylaminosilyl)-N-ethylethanamine, other silicon-containing compounds, other precursors of low index materials and/or combinations thereof. Once the second precursor has been exposed to the high refractive index layer for the predetermined time, the reactor may be purged for about 0.5 s, about 1 s, about 1.5 s, about 2 s, about 2.5 s, about 3 s about 3.5 s, about 4 s or for about 5 s or greater.

Next, a step 70 of exposing the second precursor on the high refractive index layer to a second oxidizer such that the second precursor present on the high refractive index layer reacts with the second oxidizer to form a low refractive index layer of the film 18 is performed. According to various examples, the low refractive index layer may be the index layer 30. The second oxidizer may include water vapor, ozone, other materials which may oxidize the second precursor and/or combinations thereof. The second oxidizer may be exposed to the second precursor for a time period ranging from about 0.1 s to about 0.6 s, or from about 0.1 s to about 0.5 s, or from about 0.1 s to about 0.4 s, or from about 0.1 s to about 0.3 s, or from about 0.1 s to about 0.1 s to about 0.2 s. For example, the second oxidizer may be exposed to the second precursor for about 0.1 s, about 0.2 s, about 0.3 s, about 0.4 s, about 0.5 s, about 0.6 second and any and all values and ranges therebetween.

According to various examples, steps 54-70 may be performed at an elevated temperature. For example, steps 54-70 may be performed at a temperature of from about 20° C. to about 400° C., or from about 100° C. to about 400° C., or from about 200° C. to about 300° C. For example, steps 54-70 may be performed at a temperature of about 20° C., about 30° C., about 40° C., about 50° C., about 60° C., about 70° C., about 80° C., about 90° C., about 100° C., about 150° C., about 200° C., about 250° C., about 300° C., about 350° C., about 400° C. or any and all ranges and values therebetween. It will be understood that all the values and ranges disclosed above may be the temperature of the lens 14, and layers formed on the lens 14 and/or the temperature at which the first and/or second precursors and/or oxidizers are introduced to the reactor. For example, the method 50 may include a step of heating the substantially transparent lens 14 to a temperature of from about 50° C. to about 350° C.

It will be understood that although the steps of the method 50 were described in a particular order, the method 50 may include additional steps, omit steps, be repeated or performed in any order where applicable without departing from the teachings provided herein.

The use of atomic layer deposition to produce the film 18 may offer a variety of advantages. For example, use of atomic layer deposition provides a self-limiting film growth technology which enabling precise thickness control of various layers of the film 18 as well as the opportunity to simultaneously multiple surfaces of lens 14 as well as the ability to coat multiple lenses 14 simultaneously. The use of atomic layer deposition allows high, or steep, curvature surfaces such as the curved surfaces 22 to be evenly coated while minimizing or eliminating conventional masking processes. As the atomic layer deposition process may simplify tooling fixtures used to secure the lens 14 within the reactor, a reduced risk of mechanical damage to the lenses 14 may be realized as compared to conventional physical vapor deposition processes.

Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

It will be understood by one having ordinary skill in the art that construction of the described disclosure, and other components, is not limited to any specific material. Other exemplary embodiments of the disclosure disclosed herein may be formed from a wide variety of materials, unless described otherwise herein.

It will be understood that any described processes, or steps within described processes, may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and, further, it is to be understood that such concepts are intended to be covered by the following claims, unless these claims, by their language, expressly state otherwise. Further, the claims, as set forth below.

What is claimed is:

1. An optical element, comprising:
    an optically transparent lens defining a curved surface, wherein the optically transparent lens comprises a refractive index in the range from about 1.45 to about 1.55 at a wavelength of about 266 nm; and
    a film positioned on the curved surface, the film comprising:
        a first layer of hafnium oxide ($HfO_2$) positioned on the curved surface,
        a second layer of aluminum fluoride ($AlF_3$) positioned on the first layer, and
        a third layer of silicon dioxide ($SiO_2$) positioned on the second layer.

2. The optical element of claim 1, wherein the film has a thickness of about 60 nm to 70 nm.

3. The optical element of claim 1, wherein the first layer of hafnium oxide has a thickness of about 1 nm to about 8 nm, wherein the second layer of aluminum fluoride has a thickness of about 50 nm to about 60 nm and, wherein the third layer of silicon dioxide has a thickness of about 1 nm to about 2 nm.

4. An optical element, comprising:
    an optically transparent lens defining a curved surface, wherein the optically transparent lens comprises a refractive index in the range from about 1.45 to about 1.55 at a wavelength of about 266 nm; and
    a film positioned on the curved surface, the film comprising:
        a first layer of aluminum oxide ($Al_2O_3$) positioned on the curved surface,
        a second layer of aluminum fluoride ($AlF_3$) positioned on the first layer, and
        a third layer of silicon dioxide ($SiO_2$) positioned on the second layer.

5. The optical element of claim 4, wherein the film has a thickness of about 60 nm to 70 nm.

6. The optical element of claim 4, wherein the first layer of aluminum oxide has a thickness of about 15 nm to about 20 nm, wherein the second layer of aluminum fluoride has a thickness of about 35 nm to about 40 nm and, wherein the third layer of silicon dioxide has a thickness of about 1 nm to about 2 nm.

7. An optical element, comprising:
    an optically transparent lens defining a curved surface, wherein the optically transparent lens comprises a refractive index in the range from about 1.45 to about 1.55 at a wavelength of about 266 nm; and
    a film positioned on the curved surface, the film comprising:
        a first layer of lanthanum fluoride ($LaF_3$) positioned on the curved surface,
        a second layer of aluminum fluoride ($AlF_3$) positioned on the first layer, and
        a third layer of silicon dioxide ($SiO_2$) positioned on the second layer.

8. The optical element of claim 7, wherein the first layer of aluminum oxide has a thickness of about 25 nm to about 28 nm, wherein the second layer of aluminum fluoride has a thickness of about 30 nm to about 32 nm and, wherein the third layer of silicon dioxide has a thickness of about 1 nm to about 2 nm.

9. An optical element, comprising:
    an optically transparent lens defining a curved surface, wherein the optically transparent lens comprises a refractive index in the range from about 1.45 to about 1.55 at a wavelength of about 266 nm; and
    a film positioned on the curved surface, the film comprising:
        a first layer of aluminum fluoride ($AlF_3$) positioned on the curved surface,
        a second layer of lanthanum fluoride ($LaF_3$) positioned on the first layer,
        a third layer of aluminum fluoride ($AlF_3$) positioned on the second layer, and
        a fourth layer of silicon dioxide ($SiO_2$) positioned on the third layer.

10. The optical element of claim 9, wherein the film has a thickness of about 60 nm to 70 nm.

11. The optical element of claim 9, wherein the first layer of aluminum fluoride has a thickness of about 1 nm to about 2 nm, wherein the second layer of lanthanum fluoride has a thickness of about 25 nm to about 28 nm, wherein the third layer of aluminum fluoride has a thickness of about 30 nm to about 32 nm and, wherein the fourth layer of silicon dioxide has a thickness of about 1 nm to about 2 nm.

12. An optical element, comprising:
- an optically transparent lens defining a curved surface, wherein the optically transparent lens comprises a refractive index in the range from about 1.45 to about 1.55 at a wavelength of about 266 nm; and
- a film positioned on the curved surface, the film comprising:
  - a first layer of aluminum fluoride ($AlF_3$) positioned on the curved surface,
  - a second layer of lanthanum fluoride ($LaF_3$) positioned on the first layer,
  - a third layer of aluminum fluoride ($AlF_3$) positioned on the second layer,
  - a fourth layer of lanthanum fluoride ($LaF_3$) positioned on the third layer,
  - a fifth layer of aluminum fluoride ($AlF_3$) positioned on the fourth layer, and
  - a sixth layer of silicon dioxide ($SiO_2$) positioned on the fifth layer.

13. The optical element of claim 12, wherein the film has a thickness of about 60 nm to 70 nm.

14. The optical element of claim 12, wherein the first layer of aluminum fluoride has a thickness of about 1 nm to about 2 nm, wherein the second layer of lanthanum fluoride has a thickness of about 10 nm to about 15 nm, wherein the third layer of aluminum fluoride has a thickness of about 30 nm to about 32 nm, wherein the fourth layer of lanthanum fluoride has a thickness of about 1 nm to about 2 nm, wherein the fifth layer of aluminum fluoride has a thickness of about 1 nm to about 2 nm and, wherein the sixth layer of silicon dioxide has a thickness of about 1 nm to about 2 nm.

* * * * *